United States Patent [19]

Masumi et al.

[11] Patent Number: 5,508,149
[45] Date of Patent: Apr. 16, 1996

[54] SILVER HALIDE COLOR PHOTOGRAPHIC LIGHT-SENSITIVE MATERIAL AND A METHOD FOR FORMING A COLOR IMAGE BY USING THE SAME

[75] Inventors: Satoshi Masumi; Shun Takada, both of Odawara, Japan

[73] Assignee: Konica Corporation, Japan

[21] Appl. No.: 357,764

[22] Filed: Dec. 15, 1994

Related U.S. Application Data

[63] Continuation of Ser. No. 159,429, Nov. 30, 1993, abandoned.

[30] Foreign Application Priority Data

Dec. 4, 1992 [JP] Japan ..................... 4-325680

[51] Int. Cl.$^6$ ............... G03C 7/00; G03C 7/46; G03C 1/815; G03C 1/829
[52] U.S. Cl. ............ 430/389; 430/398; 430/496; 430/517; 430/522; 430/507; 430/510; 430/383; 430/367; 430/992
[58] Field of Search ............... 430/358, 367, 430/383, 507, 510, 517, 522, 963

[56] References Cited

U.S. PATENT DOCUMENTS

| | | | |
|---|---|---|---|
| 4,994,350 | 2/1991 | Ogawa et al. | 430/949 |
| 4,994,395 | 2/1991 | Yoshizawa et al. | 430/557 |
| 5,102,778 | 4/1992 | Nakamura | 430/489 |
| 5,176,987 | 1/1993 | Nakamura et al. | 430/484 |
| 5,436,116 | 7/1995 | Hoshino et al. | 430/358 |

FOREIGN PATENT DOCUMENTS

| | | |
|---|---|---|
| 410450 | 1/1991 | European Pat. Off. . |
| 2051148 | 2/1990 | Japan . |
| 2-64630 | 3/1990 | Japan .............. 430/358 |

OTHER PUBLICATIONS

Translation of Japanese Patent Application 2051148.

Primary Examiner—Charles L. Bowers, Jr.
Assistant Examiner—J. Pasterczyk
Attorney, Agent, or Firm—Jordan B. Bierman; Bierman and Muserlian

[57] ABSTRACT

A silver halide color photographic light-sensitive material for use in preparing a color proof image from a halftone image information is provided, comprising a support having thereon blue-sensitive, green-sensitive and red-sensitive silver halide emulsion layers, in which at least one of the silver halide emulsion layers comprises silver halide grains having a silver chloride content of not less than 80 mol % and of which the reflection densities, when unprocessed, at wavelengths of 450, 550 and 700 nm each are not less than 0.8.

5 Claims, No Drawings

SILVER HALIDE COLOR PHOTOGRAPHIC LIGHT-SENSITIVE MATERIAL AND A METHOD FOR FORMING A COLOR IMAGE BY USING THE SAME

This application is a continuation of application Ser. No. 08/159,429, filed Nov. 30, 1993, now abandoned.

FIELD OF THE INVENTION

The present invention relates to a silver halide color photographic light-sensitive material and a method for forming a color image by using the same, and more particularly to a silver halide color photographic light-sensitive material which is suitable for use in preparing color proofs from transmission-type black-and-white halftone originals obtained by the color separation of colored image originals and a color image forming method which uses the light-sensitive material.

BACKGROUND OF THE INVENTION

There have heretofore been disclosed methods of using a silver halide color photographic light-sensitive material in JP O.P.I. Nos. 280747/1987, 280748/1987, 280749/1987, 280750/1987 and 280849/1987 for improving the shortcomings of the overlay and surprint methods for use in preparing color proofs from plural black-and-white halftone images obtained by the color separation/halftone conversion of color originals in the color photomechanical/printing process.

However, the silver halide emulsion used in these methods is a high-bromide silver chlorobromide emulsion, and the above publications make no mention of the practical use of a high-chloride silver halide emulsion advantageous for rapid processing as well as for environment protection.

Even in the light-sensitive material for color proof-making use there is a demand for making a practical reality the high-chloride silver halide emulsion capable of contributing to the improvement of working environment as well as of environment protection.

SUMMARY OF THE INVENTION

It is therefore an object of the present invention to provide a silver halide color photographic light-sensitive material (hereinafter also called a color light-sensitive material) which, when used for making color proofs from plural halftone image information obtained by the color separation and halftone image conversion of an original, can exhibit its aptitude for rapid processing as well as for the protection of environment without causing degradation of the resulting image, and also to provide a color image forming method which uses the same color light-sensitive material.

The above object of the invention is accomplished by a silver halide color photographic light-sensitive material comprising a support having thereon blue-, green- and red-sensitive emulsion layers, in which at least one of the emulsion layers comprises silver halide grains having a silver chloride content of not less than 80 mol % and of which the reflection densities, when unprocessed, at wavelengths of 450 nm, 550 nm and 700 nm each are not less than 0.8, and further by a method for the formation of a color image which comprises processing the above color light-sensitive material in a color developer solution comprising a developing agent represented by Formula II.

DETAILED DESCRIPTION OF THE INVENTION

It is preferable that the blue-sensitive emulsion layer of the above color light-sensitive material contain at least one of couplers represented by Formula I and the thickness of the support be 80 to 180 μm.

Firstly, the yellow coupler represented by Formula I of the invention is described.

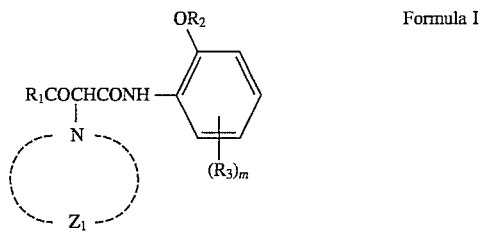

Formula I wherein $R_1$ represents an alkyl group or a cycloalkyl group; $R_2$ represents an alkyl group, a cycloalkyl group or an aryl group; $R_3$ represents a group substitutable to the benzene ring; m is an integer of 0 to 4, provided, when m is 2 or more, the plural $R_3$ may be either the same or different; and $Z_1$ is a group of nonmetallic atoms necessary to form a 5- or 6-member ring together with the nitrogen atom.

In the above Formula I, the alkyl group represented by $R_1$ is a straight-chain or branched-chain alkyl group such as methyl, ethyl, i-propyl, t-butyl, dodecyl, 1-hexylnonyl; and the cycloalkyl group represented by $R_1$ includes cyclopropyl, cyclohexyl and adamantyl.

These alkyl and cycloalkyl groups each may further have a substituent, examples of which include halogen atoms such as chlorine, bromine; a cyano group; aryl groups such as phenyl, p-t-octylphenyl, 2,4-di-t-amylphenyl; a hydroxyl group; alkoxy groups such as methoxy, 2-ethoxyethoxy; aryloxy groups such as phenoxy, 2,4-di-t-amylphenoxy, 4-(4-hydroxyphenylsulfonyl)phenoxy; hetrocyclic oxy groups such as 4-pyridyloxy, 2-hexahydropyranyloxy; carbonyloxy groups including an alkylcarbonyloxy group such as acetyloxy, pivaloyloxy, and an aryloxy group such as benzoyloxy; sulfonyloxy groups including alkylsulfonyl groups such as methanesulfonyloxy, trifluoromethanesulfonyloxy, dodecanesulfonyloxy, and arylsulfonyloxy groups such as benzenesulfonyloxy, p-toluenesulfonyloxy; carbonyl groups including alkylcarbonyl groups such as acetyl, pivaloyl, and arylcarbonyl groups such as benzoyl, 3,5-di-t-butyl-4-hydroxybenzoyl; oxycarbonyl groups including alkoxycarbonyl groups such as methoxycarbonyl, cyclohexyloxycarbonyl, dodecyloxycarbonyl, aryloxycarbonyl groups such as 2,4-di-t-amylphenoxycarbonyl, and heterocyclic oxycarbonyl groups such as 2-pyridyloxycarbonyl; carbamoyl groups including alkylcarbamoyl groups such as dimethylcarbamoyl, 4-(2,4-di-t-amylphenoxy)butylaminocarbonyl, and arylcarbamoyl groups such as phenylcarbamoyl, 1-naphthylcarbamoyl; sulfonyl groups including alkylsulfonyl groups such as methanesulfonyl, trifluoromethanesulfonyl, and arylsulfonyl groups such as p-toluenesulfonyl; sulfamoyl groups including alkylsulfamoyl groups such as dimethylsulfamoyl, 4-(2,4-di-t-amylphenoxy)butylaminosulfonyl, arylsulfamoyl groups such as phenylsulfamoyl, and acylsulfamoyl groups such as acetylsulfamoyl, ethylcarbonylaminosulfonyl; amino groups including alkylamino groups such as dimethylamino, cyclohexylamino, dodecylamino, and arylamino groups such as anilino, p-t-octylanilino; sulfonamido groups including alkylsulfonamido groups such as methanesulfonamido, heptafluoropropanesulfonamido, hexadecylsulfonamido, and arylsulfonamido groups such as p-toluenesulfonamido, pentafluorobenzenesulfonamido; acylamino groups including alkylcarbonylamino groups such as acetylamino, myristoylamino, and arylcarbonylamino groups such as benzoylamino; alkylthio groups such as methylthio, t-octylthio; arylthio groups such as phenylthio; and heterocyclic thio groups such as 1-phenyltetrazole-5-thio, 5-methyl-1,3,4-oxadiazole-2-thio.

$R_1$ is preferably an alkyl group, more preferably a branched-chain alkyl group, and most preferably t-butyl group.

The alkyl group and cycloalkyl group represented by $R_2$ are the same as those defined for $R_1$. The aryl group represented by $R_2$ is such as phenyl or 1-naphthyl. These alkyl, cycloalkyl and aryl groups represented by $R_2$ each may have a substituent. Examples of the substituent include the same alkyl and cycloalkyl groups as defined for $R_1$ and the same groups defined as the substituent to the alkyl and cycloalkyl groups represented by $R_1$.

$R_2$ is preferably an alkyl group, more preferably unsubstituted alkyl group, and most preferably methyl.

Examples of the group substitutable to the benzene ring represented by $R_3$ include the same group defined as the substituent to the alkyl, cycloalkyl and aryl groups represented by $R_2$. $R_3$ is preferably an acylamino, sulfonamido, oxycarbonyl or sulfamoyl group.

m is an integer of 0 to 4. Where m represents 2 or more, the plural $R_3$s may be either the same or different. m is preferably 1.

Examples of the group of nonmetallic atoms represented by $Z_1$ to form a 5- or 6-member ring together with the nitrogen atom include methylene, methine, substituted methine, —C(O)—, —N($R_4$)— (wherein $R_4$ is a hydrogen atom, an alkyl group, an aryl group or a heterocyclic group), —N=, —O— and —S(O)u— (u is an integer of 0 to 2).

The preferred among compounds represented by Formula I are those represented by the following Formula XI.

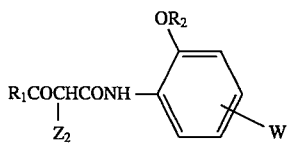

Formula XI

In Formula XI, $R_1$ and $R_2$ are as defined for the $R_1$ and $R_2$ in the foregoing Formula I; and [0022] W represents a group represented by the following Formula XII:

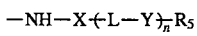

Formula XII

In Formula XII, X represents a carbonyl group or a sulfonyl group, and preferably a carbonyl group; L is an alkylene group or an arylene group, such as a straight-chain or branched-chain alkylene group such as methylene, ethylene, 2,3-propylene, 1,2-cyclohexylene, 1,4-phenylene, 1,2-naphthylene or 9,10-anthranylene; the preferred among them is an alkylene group having 1 to 6 carbon atoms; Y represents a divalent linkage group, examples of which include a sulfinyl group, a sulfenyl group, a sulfonyl group, a sulfamoyl group, a carbonyl group, a carbonyloxy group, a carbamoyl group, an oxy group, an oxycarbonyl group, an amino group, an acylamino group and a sulfonamido group; the preferred among these linkage groups are the sulfonyl, sulfamoyl, carbonyloxy, carbamoyl, oxy, oxycarbonyl and acylamino groups, and the most preferred among them are sulfonyl, oxy, oxycarbonyl and carbamoyl groups; n is an integer of 0 or 1; and $R_5$ represents an alkyl group, a cycloalkyl group or an aryl group.

These alkyl group, cycloalkyl and aryl groups represented by $R_5$ include the same groups as those exemplified for the alkyl, cycloalkyl and aryl groups represented by the $R_2$ of Formula I. The alkyl, cycloalkyl and aryl groups represented by $R_5$ may each have a substituent. Examples of the substituent include the same groups exemplified as the substituent to the alkyl, cycloalkyl and aryl groups represented by the $R_2$ in Formula I.

The substituent represented by $Z_2$ in the above Formula XI preferably includes those represented by the following Formulas XIII, XIV, XV, XVI, XVII and XVIII.

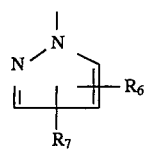

Formula XIII

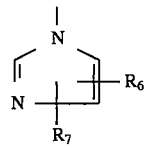

Formula XIV

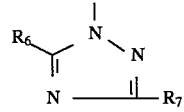

Formula XV

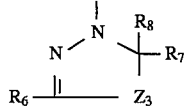

Formula XVI

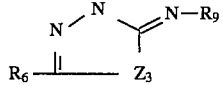

Formula XVII

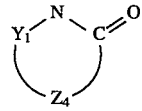

Formula XVIII

In Formulas XIII, XIV, XV, XVI, XVII and XVIII, $R_6$, $R_7$ and $R_8$ each represent a group substitutable to the azole ring, which include the same alkyl, cycloalkyl and aryl groups defined as the substituents represented by the $R_2$ in Formula I.

In Formula XVII, $R_9$ represents an alkyl group, a cycloalkyl group, an aryl group, a carbonyl group or a sulfonyl group.

In Formulas XVI and XVII, $Z_3$ represents —N($R_{10}$)— ($R_{10}$ is a hydrogen atom, an alkyl group, an aryl group or a heterocyclic group), —O— and —S(O)$_v$— (v is an integer of 0 to 2).

In Formula XVIII, $Y_1$ represents —N($R_{11}$)— ($R_{11}$ represents the same group as defined for $R_{10}$), —O— and S(O)$_r$— (r is an integer of 0 to 2), —C(O)—, —C($R_{12}$)($R_{13}$)— ($R_{12}$ and $R_{13}$ each represent a hydrogen atom or a group identical with one of those defined as the substituent to the alkyl, cycloalkyl and aryl groups represented by the $R_2$ of Formula I) or —C($R_{14}$)— ($R_{14}$ is a hydrogen atom or a group identical with one of those defined as the substituent to the alkyl, cycloalkyl and aryl groups represented by the $R_2$ of Formula I); and $Z_4$ represents a group of nonmetallic atoms necessary to form a 5- or 6-member ring in cooperation with the —$Y_1$—N—CO—, wherein examples of the group of nonmetallic atoms necessary for the ring include the same group of atoms as defined for Z in Formula I.

The preferred among compounds represented by Formula XI are those represented by the following Formula XIX:

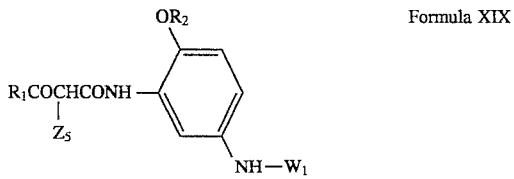

Formula XIX

In Formula XIX, $R_1$ and $R_2$ are as defined for the $R_1$ and $R_2$ in Formula I; $Z_5$ is as defined in Formula XVIII, but is a group having a molecular weight of not more than 235 when in the condition of being represented by the following Formula XX (the condition where a hydrogen atom is added to the $Z_5$ that has split off the compound represented by Formula XIX by the reaction with the oxidation product of a developing agent);

Formula XX and $W_1$ represents a group represented by the following Formula XXI, XXII or XXIII:

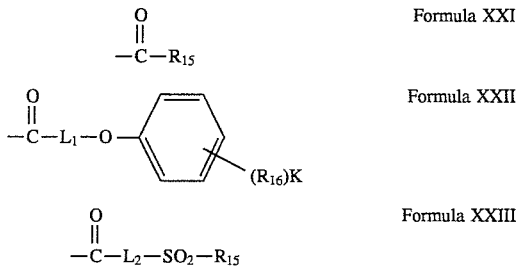

Formula XXI

Formula XXII

Formula XXIII

In Formulas XXI and XXIII, $R_{15}$ represents an alkyl group or a cycloalkyl group, which may be the same alkyl or cycloalkyl group as defined for the $R_1$ of Formula I. The alkyl or cycloalkyl group represented by $R_{15}$ may have a substituent. Examples of the substituent include the same groups defined as the substituent to the alkyl, cycloalkyl and aryl groups represented by the $R_2$ of Formula I. The preferred among these alkyl and cycloalkyl groups represented by $R_{15}$ is a nonsubstituted alkyl group.

In Formula XXII, $R_{16}$ represents a group substitutable to the benzene ring, which may be one identical with the group defined as the substituent to the alkyl, cycloalkyl and aryl groups represented by the $R_2$ of Formula I, and is preferably a nonsubstituted alkyl group, more preferably a nonsubstituted branched-chain alkyl group, and most preferably a nonsubstituted branched-chain alkyl group having 3 to 12 carbon atoms; and [0044] k is an integer of 0 to 5, provided when k is 2 or more, the plural $R_{16}$s may be either the same of different; k is preferably 2.

In Formulas XXII and XXIII, $L_1$ and $L_2$ each represent an alkylene group, which may be the same alkylene group as defined for the L of Formula XII.

In Formula XXII, $L_1$ is preferably an alkylene group having 3 to 7 carbon atoms, more preferably a 1,3-propylene, 1,1-propylene, 1,1-pentylene or 1,1-hexylene group, and most preferably a 1,3-propylene or 1,1-propylene group.

In Formula XXIII, $L_2$ is preferably an alkylene group having 3 to 7 carbon atoms, more preferably a 1,3-propylene, 2,2-propylene, 2,3-propylene or 1,1-propylene group, and most preferably a 1,3-propylene or 2,3-propylene group.

The preferred among compounds represented by Formula XIX are those represented by the following Formula XXIV.

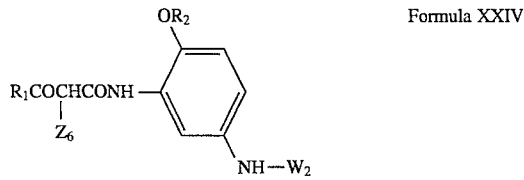

Formula XXIV

In Formula XXIV, $R_1$ and $R_2$ are as defined for the $R_1$ and $R_2$ of Formula I; and $W_2$ represents a group represented by the following Formula XXV or XXVI.

Formula XXV

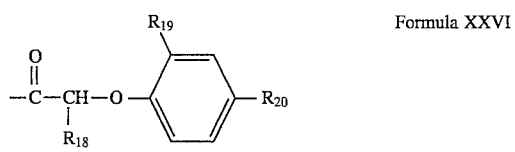

Formula XXVI

In Formula XXV, $R_{17}$ represents a nonsubstituted straight-chain or branched-chain alkyl group having 11 to 21 carbon atoms.

In Formula XXVI, $R_{18}$ is a hydrogen atom or a nonsubstituted straight-chain or branched-chain alkyl group having 1 to 6 carbon atoms, and is preferably an ethyl, butyl or hexyl group; and $R_{19}$ and $R_{20}$ each represent a hydrogen atom or a branched-chain alkyl group having 4 to 12 carbon atoms, provided the total number of carbon atoms of $R_{19}$ and $R_{20}$ is 4 to 16.

In Formula XXIV, $Z_6$ represents a group identical with the group represented by the foregoing Formula XVIII, but is one having a molecular weight of not more than 160 in the condition of being represented by Formula XX (the condition where a hydrogen atom is added to the $Z_6$ that has split off the compound represented by Formula XXIV due to its reaction with the oxidized product of a developing agent).

The preferred among compounds represented by Formula XXIV are those represented by the following Formula XXVII:

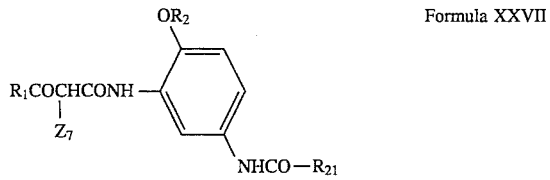

Formula XXVII

In Formula XXVII, $R_1$ and $R_2$ are as defined for the $R_1$ and $R_2$ of Formula I; $R_{21}$ represents a nonsubstituted straight-chain alkyl group having 11 to 21 carbon atoms; and $Z_7$ is the same group as that represented by Formula XVIII, but is one having a molecular weight of not more than 128 in the condition of being represented by Formula XX (the condition where a hydrogen atom is added to the $Z_7$ that has split off the compound represented by Formula XXVII due to its reaction with the oxidized product of a developing agent).

Two-equivalent yellow couplers represented by Formula I may form a bis-, tris- or tetrakis-type compound or a polymer by coupling at some substituent thereof.

The yellow coupler represented by Formula I of the invention can be easily synthesized by using a readily commercially available compound as a starting raw material in accordance with conventionally known methods, such as those described in JP O.P.I. No. 123047/1988 and JP Application No. 245949/1990.

Examples of the split-off group Z in Formula I of the invention are given below, in which each parenthesized number is the molecular weight of each compound in the condition where a hydrogen atom is added to the Z that has split off the compound of Formula I upon its reaction with the oxidized product of a developing agent.

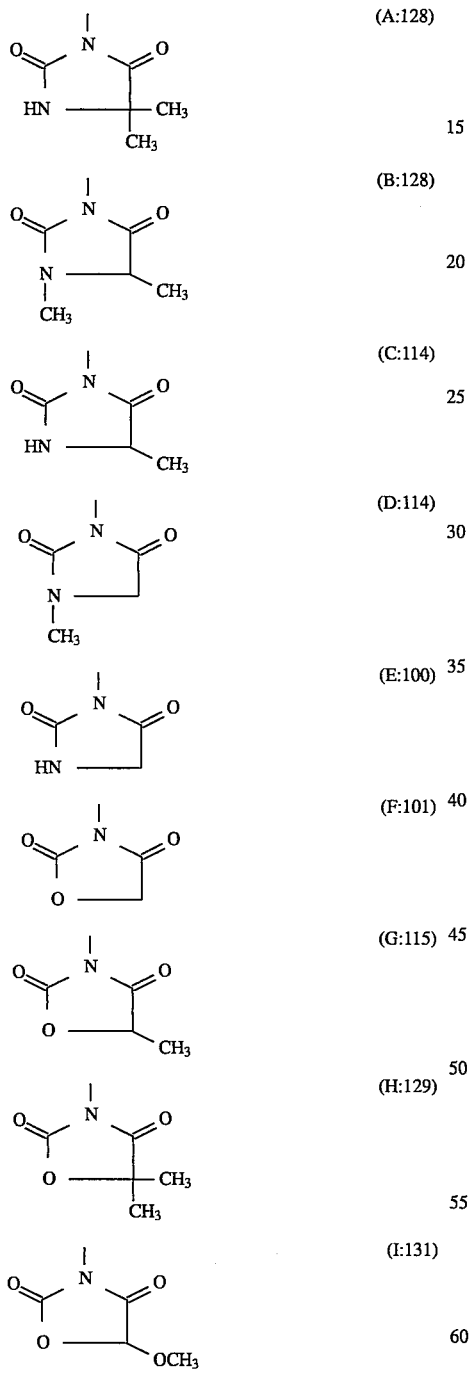

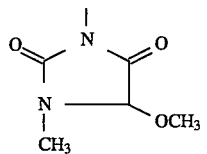

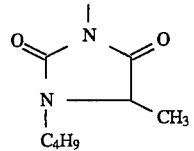

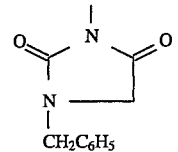

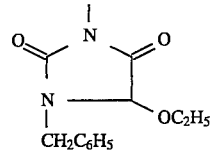

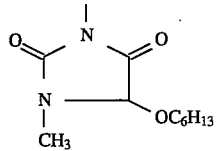

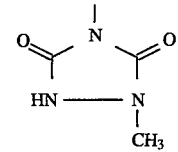

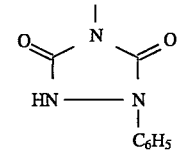

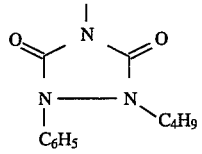

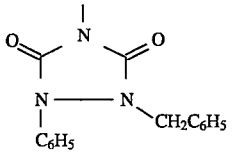

(S:176)

(T:125)

(U:154)

(V:196)

(W:187)

(X:297)

(α:153)

The following are examples of the substituent $R_3$ in Formula I of the invention.

$-NHCOC_{11}H_{23}$ (a)

$-NHCOC_{13}H_{27}$ (b)

$-NHCOC_{15}H_{31}$ (c)

$-NHCOC_{17}H_{35}$ (d)

$-NHCOC_{19}H_{39}$ (e)

$-NHCOC_{21}H_{43}$ (f)

$-NHCOCHC_8H_{17}$
       |
       $C_6H_{13}$ (g)

$-NHCOCHCH_2C(CH_3)_3$
       |
       $CH_3$ $CH_2CH_2CHCH_2C(CH_3)_3$
              |
              $CH_3$ (h)

(i) 2,4-di-$C_5H_{11}(t)$-phenoxy, $-NHCOCHO-$, $C_2H_5$ (j) 2,4-di-$C_5H_{11}(t)$-phenoxy, $-NHCOCHO-$, $C_4H_9$ (k) 2,4-di-$C_5H_{11}(t)$-phenoxy, $-NHCOCHO-$, $C_6H_{13}$ (l) 4-$C_5H_{11}(t)$-phenoxy, $-NHCOCHO-$, $C_2H_5$ (m) 3-$C_4H_9(t)$-4-OH-phenoxy, $-NHCOCHO-$, $C_{10}H_{21}$ (n) 2,4-di-$C_5H_{11}(t)$-phenoxy, $-NHCO(CH_2)_3O-$ $-NHCOCHCH_2SO_2C_{12}H_{25}$
       |
       $CH_3$ (o)

$-NHCO(CH_2)_3SO_2C_{12}H_{25}$ (p)

$-NHCOCH_2CHCOOH$
              |
              $C_{18}H_{35}$ (q)

$-NHCOCH_2CH_2COOC_{12}H_{25}$ (r)

$-NHSO_2C_{12}H_{25}$ (s)

(t) 2-$OC_8H_{17}(n)$-5-$OC_8H_{17}(t)$-phenyl-$NHSO_2-$ $-COOC_{14}H_{29}$ (u)

$-COCHCOOC_{12}H_{25}$
       |
       $C_4H_9$ (v)

$-CONHC_{14}H_{29}$ (w)

$-SO_2NHCOC_2H_5$ (x)

The following are examples of the two-equivalent yellow coupler of Formula I of the invention, but the invention is not limited thereto.

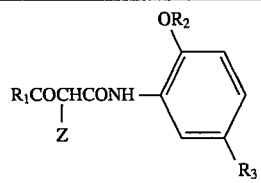

| No. | $R_1$ | $R_2$ | $R_3$ | Z |
|---|---|---|---|---|
| (1) | t-$C_4H_9$ | $CH_3$ | (d) | (A) |
| (2) | " | " | (c) | (A) |
| (3) | " | " | (d) | (B) |
| (4) | " | " | (d) | (D) |
| (5) | " | " | (f) | (E) |
| (6) | " | " | (d) | (G) |
| (7) | " | " | (k) | (H) |
| (8) | " | " | (c) | (L) |
| (9) | " | " | (g) | (H) |
| (10) | " | " | (t) | (H) |
| (11) | " | " | (h) | (H) |
| (12) | " | " | (i) | (A) |
| (13) | " | " | (j) | (A) |
| (14) | " | " | (l) | (A) |
| (15) | " | " | (i) | (N) |
| (16) | " | " | (h) | (N) |
| (17) | " | " | (u) | (L) |
| (18) | " | " | (e) | (M) |
| (19) | " | " | (j) | (J) |
| (20) | " | " | (m) | (A) |
| (21) | " | " | (o) | (A) |
| (22) | " | " | (p) | (P) |
| (23) | " | " | (d) | (P) |
| (24) | " | " | (d) | (Q) |
| (25) | " | " | (o) | (Q) |
| (26) | " | " | (r) | (K) |
| (27) | " | " | (o) | (K) |
| (28) | t-$C_4H_9$ | $CH_3$ | (a) | (S) |
| (29) | " | " | (g) | (T) |
| (30) | " | " | (k) | (T) |
| (31) | " | " | (n) | (U) |
| (32) | " | " | (g) | (W) |
| (33) | " | " | (l) | (W) |
| (34) | " | " | (i) | (X) |
| (35) | " | " | (u) | (N) |
| (36) | " | " | (t) | (B) |
| (37) | " | " | (w) | (R) |
| (38) | " | —⟨C₆H₄⟩—$CH_3$ | (h) | (A) |
| (39) | " | —⟨C₆H₃⟩($C_5H_{11}$(t))($C_5H_{11}$(t)) | (c) | (H) |
| (40) | " | cyclopropyl | (d) | (A) |
| (41) | adamantyl | $CH_3$ | (q) | (H) |
| (42) | t-$C_4H_9$ | $C_{16}H_{33}$ | (d) | (α) |
| (43) | " | $CH_3$ | (c) | (α) |
| (44) | " | " | (x) | (W) |
| (45) | " | " | (u) | (H) |

Reflection densities of the light-sensitive material in the invention are values measured by means of a Color-Analyzer 607, manufactured by Hitachi, Ltd.

Making the reflection densities of the unprocessed light-sensitive material of the invention at wavelengths of 450 nm, 550 nm and 700 nm not less than 0.s is accomplished preferably by a method of adding yellow, magenta and cyan dyes in the form of their solutions and/or dispersions to the light-sensitive material and/or a method of providing an antihalation layer as the bottom layer of the light-sensitive material.

The antihalation layer is preferably present in the form of a non-light-sensitive colloid layer, and the layer preferably contains dyes and/or non-light-sensitive hydrophilic colloidal silver.

Examples of the yellow, magenta and cyan dyes used in the invention include oxonol dyes, cyanine dyes, merocyanine dyes, azo dyes, anthraquinone dyes and anilidene dyes, but of these the most preferred from the standpoint of the high-decomposability and non-color-sensitizability to the silver halide emulsion are the oxonol and merocyanine dyes.

The oxonol dyes are described in U.S. Pat. No. 4,187,225, JP O.P.I. Nos. 58437/1988 and 139949/1988, while the merocyanine dyes in JP O.P.I. No. 35437/1988 and 58437/1988.

Each dye is added in such an amount as to make the reflection densities of the color light-sensitive material remaining unprocessed at wavelengths of 450 nm, 550 nm and 700 nm each not less than 0.8. The reflection densities each are preferably in the range of 0.9 to 1.2

The dye in the invention is incorporated into the light-sensitive silver halide emulsion layer and/or non-light-sensitive layer of the color light-sensitive material.

The dye of the invention is used in combination of yellow, magenta and cyan dyes, and the respective yellow, magenta and cyan dyes each may be used alone or in combination of two or more kinds thereof.

Next, the color developing agent used in the invention is described.

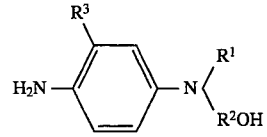

Formula II wherein $R^1$ represents an alkyl group having 1 to 4 carbon atoms; $R^2$ is a straight-chain or branched-chain alkylene group having 2 to 4 carbon atoms; and $R^3$ is a hydrogen atom or an alkyl group having 1 to 4 carbon atoms.

Examples of $R^1$ include methyl, ethyl, propyl, i-propyl, butyl, sec-butyl; those of $R^2$ include ethylene, propylene, butylene, 1-methylene, 2-methylene, 1-methylpropylene, 3-methylpropylene; and those of $R^3$ include a hydrogen atom, methyl, ethyl, propyl, i-propyl, butyl, sec-butyl.

In the above substituents, $R^1$ is preferably ethyl or propyl; the principal chain as $R^2$ is preferably ethylene, propylene or butylene,; and $R^3$ is preferably a hydrogen atom, methyl or ethyl.

The compound of Formula II, when stored in the form of a free amine, is very unstable, so it is preferable that the compound be produced and stored generally in the form of its salt of an inorganic or organic acid and be converted into a free amine when added to a developer solution. The inorganic and organic acids usable for making salts of the compound of Formula II include hydrochloric acid, sulfuric acid, phosphoric acid, p-toluenesulfonic acid, methanesulfonic acid, naphthalene-1,5-disulfonic acid, and the like.

The following are examples of the color developing agent of the invention, but the invention is not limited thereto.

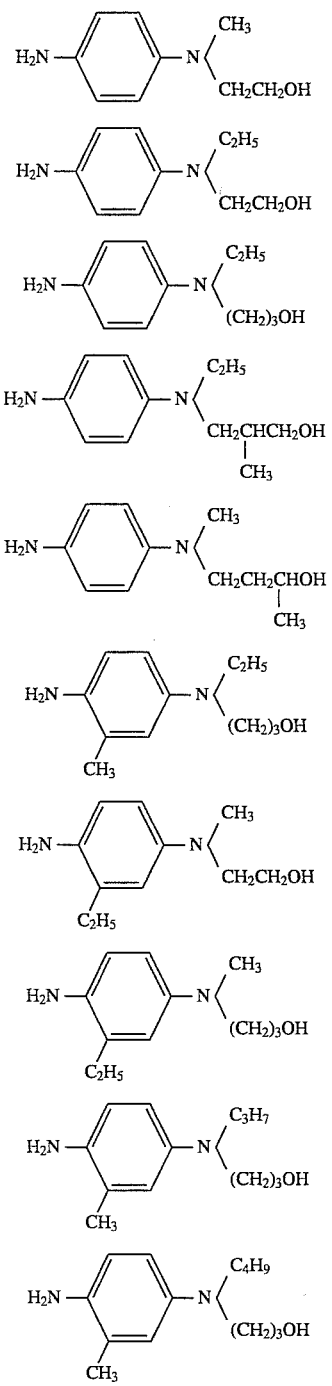

The adding amount of the color developing agent is not less than 0.01 mol, and preferably in the range of 0.015 to 0.03 mol per liter of a color developer solution.

To the color developer solution may be added known additives such as an alkali agent, a preservative, an antifoggant, a brightening agent, a defoaming agent and a development accelerator.

The color developing time, although not restricted, is normally 30 seconds to 4 minutes, and the color developing temperature is normally 20° to 45° C.

For the bleach-fix processing of the color light-sensitive material known bleaching and fixing agents can be used.

Useful magenta couplers include 5-pyrazolone couplers, pyrazoloazole couplers, pyrazolinobenzimidazole couplers, indazolone couplers and acylacetonitrile couplers, which are described in U.S. Pat. Nos. 2,600,788, 3,062,653, 3,512,896, 3,558,318 and 3,930,866; JP O.P.I. Nos. 29639/1974 and 1304/1975. Particularly preferred are the pyrazoloazole couplers represented by the following Formula M:

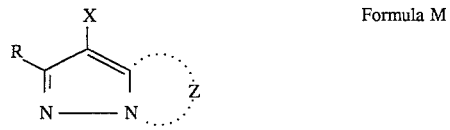

Formula M wherein Z represents a group of nonmetallic atoms necessary to form a nitrogen-containing heterocyclic ring, which may have a substituent; X represents a hydrogen atom or a group capable of splitting off the compound upon its reaction with the oxidized product of a color developing agent; and R is a substituent.

Preferred examples usable in the invention are the compounds described in pp.5–30 of JP O.P.I. No. 163444/1991. Examples of the above magenta coupler include Couplers No.1 to No.61 described in pp.16–29 of the same publication, and Couplers M-1 to M-41 described in pp.34–58 of JP O.P.I. No. 208653.

Cyan couplers generally used are phenol couplers and naphthol couplers. These couplers are described in U.S. Pat. Nos. 2,369,992, 2,432,272, 2,698,974, 3,034,892 and 3,839,044, JP O.P.I. Nos. 3742/1972, 112038/1975, 130441/1975 and 251845/1990.

Examples of the cyan coupler include Couplers No.I-1 to I-31 in pp.4–5 and Couplers II-1 to II-20 in pp.6–7 of JP O.P.I. No. 251845/1990. Further, including these compounds, examples of the cyan coupler usable in the invention are described in JP E.P. No. 11572/1974, JP O.P.I. Nos. 3142/1986, 9652/1986, 9652/1986, 39045/1986, 50136/1986, 9914/1986 and 105545/1961. Particularly preferred are diacylaminophenol cyan couplers.

The incorporation of the coupler of the invention into the light-sensitive material may be carried out according to various methods. For example, the coupler is dissolved in an organic high-boiling solvent such as a phthalate, a phosphate, a phenol derivative, an alkylamide, etc., and emulsified to be used, in which the organic high-boiling solvent is preferably one of those compounds described in JP O.P.I. Nos. 231340/1988, 241547/1988, 253943/1988 and 11262/1989, and most preferably of those represented by the following Formula HB:

Formula HB wherein $R^{11}$, $R^{12}$ and $R^{13}$ each represent an alkyl group, a cycloalkyl group or an aryl group; and p, q and r each represent an integer of 0 or 1.

These organic high-boiling solvents are used in an amount of preferably 10 to 500% by weight to the coupler used. In dissolving the coupler of the invention in the above organic high-boiling solvent, a low-boiling organic solvent can be used together. At the time of or after the emulsification/dispersion, there may be provided a process of removing the low-boiling solvent. In addition, at the time of the emulsification/dispersion there may be used an emulsifying agent, and further a toning agent.

The silver halide used in the invention preferably has a silver chloride content of not less than 80 mol %, a silver bromide content of not more than 20 mol %, and a silver iodide content of not more than 0.5 mol %. More preferably it is silver bromochloride whose silver bromide content is from 0.1 to 2 mol %.

The silver halide of the invention may be used alone or in a mixture with other silver halide different in the composition, or else in a mixture with a silver halide having a silver chloride content of not more than 80 mol %.

In a silver halide emulsion layer containing the silver halide grain having a silver chloride content of not less than 80 mol % of the invention, the amount of the silver halide grains having the silver chloride content of not less than 80 mol % accounts for not less than 60% by weight of the whole silver halide grains contained in the emulsion layer.

The silver halide grain of the invention may be either of a uniform composition throughout the entire grain or a not-uniform composition with difference between the inside and the outside.

The grain diameter of the silver halide grain of the invention, although not restricted, is preferably 0.2 to 1.6 μm, more preferably 0.25 to 1.2 μm in consideration of the rapid processability, sensitivity and other photographic characteristics.

The grain diameter distribution of the silver halide grains of the invention may be of either the polydisperse type or the monodisperse type; and preferably monodisperse silver halide grains of which the grain diameter distribution's variation coefficient is not more than 0.22, and more preferably not more tha 0.15, wherein the variation coefficient is defined by:

$$\frac{\text{(Standard deviation of grain diameter distribution)}}{\text{(Average grain diameter)}}$$

The silver halide grain for the emulsion of the invention may be prepared by any of the acidic, neutral or ammoniacal method. The grain may be grown at a time or, after preparing a seed grain, may be grown therefrom.

The soluble silver salt/soluble halide reaction may be carried out by any of the normal precipitation method, reverse precipitation method or double-jet precipitation method, or else by a combination of these methods. Of these the double-jet precipitation is most preferred.

The form of the silver halide grain of the invention is discretionary. A preferred example is a cubic grain with {100} 1 planes as its crystal faces.

The grain may also be an octahedral, tetradecahedral, dodecahedral or twin crystal grain. The silver halide grains used may consist on single crystal-form grains or may be a mixture of various grains different in the crystal form.

The silver halide grain used in the emulsion of the invention can have metallic ions incorporated into the inside and/or surface thereof by adding thereto a cadmium salt, a zinc salt, a lead salt, a thalium salt, an iridium salt (including complex salt), a rhodium salt (including complex salt) or an iron salt (including complex salt) during the process of forming and/or growing the grain, and can have reduction sensitization nuclei provided in the inside and/or surface thereof by being placed in an appropriately reductive atmosphere.

The silver halide emulsion, after completion of the growth of the silver halide grain, may have its useless soluble salts removed therefrom or remain intact. The removal of the salts, if necessary, can be conducted according to the appropriate method described in Research Disclosure 17643.

The silver halide grain may be either one having a latent image formed principally on its surface or one having a latent image formed principally inside; it is preferably one having a latent image formed principally on its surface.

The silver halide emulsion, in the usual manner, can be subjected to a chemical sensitization treatment (e.g., sulfur sensitization, gold sensitization, noble-metallic sensitization, selenium sensitization, reduction sensitization) and a spectral sensitization treatment (by using cyanine dyes, merocyanine dyes, hemicyanine dyes, styryl dyes or hemioxonol dyes). During the above treatments antifoggants or stabilizers known to those skilled in the art, such as azaindenes, mercapto heterocyclic compounds, may be added to the emulsion.

As the binder (or protective colloid) for the light-sensitive material of the invention gelatin is used advantageous, but in addition, there may also be used hydrophilic colloid materials such as gelatin derivatives, graft polymers of gelatin with other high-molecular compounds, proteins, sugar derivatives, cellulose derivatives, and homo- or copolymers.

The photographic emulsion layer and other hydrophilic colloid layer of the invention can be hardened by the single or combined use of hardeners capable of crosslinking binder moleculars to increase the layer strength. The hardener is added preferably in an amount so enough to harden the light-sensitive material as not necessary to be added to the processing solution, but may also be added to the processing solution. The hydrophilic colloid layer, such as a protective layer, an intermediate layer, may contain a ultraviolet absorbing agent in order to prevent the light-sensitive material from fogging due to triboelectric charging or to prevent the resulting image from degrading due to ultraviolet rays.

The light-sensitive material of the invention may have auxiliary layers such as filter layers, antihalation layer and/or antiirradiation layer. These layers and/or emulsion layers may contain a dye which, during the developing of the light-sensitive material, can elute therefrom or can be bleached.

The silver halide emulsion layer and/or other hydrophilic colloid layer may contain a matting agent for the purpose of decreasing the gloss of, increasing the retouchability of and preventing the mutual adhesion of the light-sensitive material, and may contain a sliding agent for the purpose of reducing the sliding friction.

To the light-sensitive material may be added an antistatic agent for prevention of electrostatic charging. The antistatic agent may be used in a layer on the non-emulsion-coated side of the support or may also be used in the emulsion layer and/or non-emulsion protective colloid layer on the emulsion-coated side of the support.

In the photographic layer and/or other hydrophilic colloid layer, various surface active agents may be used for the purpose of improvement of coatability, prevention of electrostatic charge, improvement of slidability, emulsification/dispersion, prevention of adhesion and improment of photographic characteristics such as of development acceleration, contrast increase and sensitization.

Examples of the support on which are provided the photographic emulsion layer and other layer of the light-sensitive material of the invention include a baryta paper, an α-olefin polymer-laminated paper, an easily-peelable α-olefin layercoated paper support, an elastic reflective support like synthetic paper, semisynthetic or synthetic high-molecular films made of cellulose acetate, cellulose nitrate, polystyrene, polyvinyl chloride, polyethylene terephthalate, polycarbonate, polyamide, etc., a reflective support coated with a white pigment, and rigid materials such as glass, metals and ceramics. The above layers may also be provided on a very thin reflective support having a thickness of 120 to 160 μm.

The support used in the invention contains a white pigment therein or has a white pigment-containing hydrophilic colloid layer coated thereon in order to be made reflective.

As the white pigment there may be used an inorganic and/or organic white pigment, preferably an inorganic white pigment, examples of which include alkalic earth metals sulfates such as barium sulfate, alkaline earth metals carbonates such as calcium carbonate, powdery silicic acid, silicas, calcium silicate, alumina, alumina hydrate, titanium oxide, zinc oxide, talc, cray and the like. The preferred among them are barium sulfate and titanium oxide.

On the support, after at need subjecting its surface to corona discharge treatment, UV irradiation treatment or flame treatment, may be coated the above layers either directly or indirectly through one or two or more subbing layers for improving the adhesion property, antistatic characteristic, dimensional stability, wear resistance, hardness, antihalation characteristic, friction property and other characteristics.

In coating the light-sensitive material, a thickener may be used in order to improve its coatability. For the coating it is very advantageous to use the extrusion coating or curtain coating method each capable of coating two or more layers simultaneously.

In the invention, the light-sensitive material, immediately after its color developing, may be processed in a bleaching capacity-having processing solution and then in a fixing capacity-having processing solution, but instead may be processed in a processing solution having both bleaching and fixing capacities, the so-called bleach-fix solution. As the bleaching agent for use in bleaching, a metallic complex salt of an organic acid is used.

EXAMPLES

The invention is illustrated further in detail by the following examples, but the invention is not limited thereto.

EXAMPLE 1

A paper support of 230 μm in thickness having its obverse side laminated with titanium oxide-containing polyethylene and having its reverse side laminated with polyethylene was used to coat the following Layers 1 to 7 on the obverse side and to coat a backing layer on the reverse side, whereby a color light-sensitive material Sample 1 was prepared.

In the following layers, the added amount of each constituent is indicated in grams per square meter (g/m²) except that the amount of silver halide emulsion is shown in grams in silver equivalent.

| Layer | Constituent | Coating amt |
|---|---|---|
| Layer 7 (protective layer) | Gelatin | 1.0 |
| | Silica (average particle size: 3 μm) | 0.03 |
| | Anti-color-crossover agent HQ-2 | 0.01 |
| | Anti-color-crossover gaent HQ-3 | 0.01 |
| Layer 6 (Inter- | Gelatin | 0.4 |
| | UV absorbent UV-1 | 0.2 |

| Layer | Constituent | Coating amt |
|---|---|---|
| layer) | UV absorbent UV-2 | 0.2 |
| | UV absorbent UV-3 | 0.2 |
| | Anti-color-crossover agent HQ-1 | 0.01 |
| | Solvent SO-3 | 0.2 |
| | PVP | 0.2 |
| | Antiirradiation dye AI-1 | 0.07 |
| Layer 5 (Red-sensitive layer) | Gelatin | 1.3 |
| | Red-sensitive silver chlorobromide emulsion (Br: 80 mol %, Cl: 20 mol %) spectrally sensitized with sensitizer RS-1 | 0.22 |
| | Cyan coupler C-1 | 0.3 |
| | Solvent SO-1 | 0.15 |
| | Anti-color-crossover agent HQ-1 | 0.02 |
| Layer 4 (Interlayer | Gelatin | 0.6 |
| | Anti-color-crossover agent HQ-1 | 0.01 |
| | Anti-color-crossover agent HQ-2 | 0.01 |
| | Solvent SO-3 | 0.2 |
| | Antiirradiation agent AI-2 | 0.01 |
| Layer 3 (Green-sensitive layer) | Gelatin | 1.2 |
| | Green-sensitive silver chlorobromide emulsion (Br: 80 mol %, Cl: 20 mol %) spectrally sensitized with sensitizer GS-1 | 0.35 |
| | Magenta coupler M-1 | 0.2 |
| | Toning agent MY-1 | 0.05 |
| | Anti-color-crossover agent HQ-1 | 0.02 |
| | Sovent SO-1 | 0.4 |
| Layer 2 (Interlayer) | Gelatin | 0.6 |
| | Anti-color-crossover agent HQ-1 | 0.02 |
| | Solvent SO-3 | 0.2 |
| | Antiirradiation dye AI-3 | 0.03 |
| Layer 1 (Blue-sensitive layer) | Gelatin | 1.2 |
| | Blue-sensitive silver chlorobromide emulsion (Br: 80 mol %, Cl: 20 mol %) spectrally sensitized with sensitizer BS-1 | 0.35 |
| | Yellow coupler Y-1 | 0.4 |
| | Anti-color-crossover agent HQ-1 | 0.02 |
| | Solvent SO-1 | 0.38 |
| Backing layer | Gelatin | 6.0 |
| | Silica (average particle size: 3 μm) | 0.1 |

In addition, coating aids SA-1 and SA-2 and hardener H-1 were used in coating the above layers.

The chemical structures of the compounds used in coating the above layers are given below:

PVP: Polyvinyl pyrrolidone

SO-1: Trioctyl phosphate

SO-2: Dioctyl phthalate

SO-3: Di(2-ethylhexyl) sebacate

HQ-1: 2,5-di-t-butyl-hydroquinone

HQ-2: 2,5-di-t-octyl-hydroquinone

HQ-3: 2-methyl-5-hexadecenyl-hydroquinone

SA-1: Sodium di(2-ethylhexyl)sulfosuccinate

SA-2: Sodium di(2,2,3,3,4,4,5,5-octafluoropentyl)sulfosuccinate

STAB-1: 1-(3-acetamido)phenyl-5-mercaptotetrazole

H-1: Sodium 2,4-dichloro-6-hydroxy-s-triazine

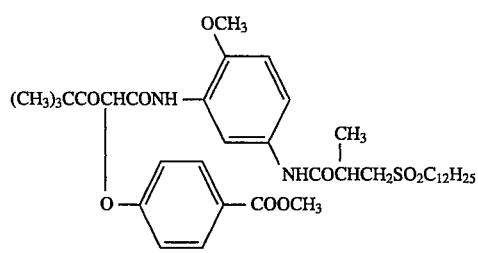
Y-1
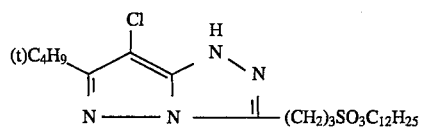
M-1
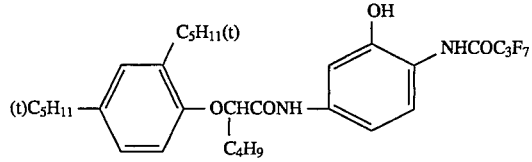
C-1
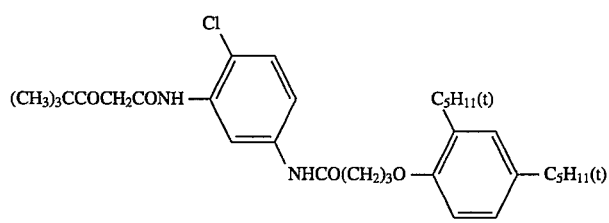
MY-1
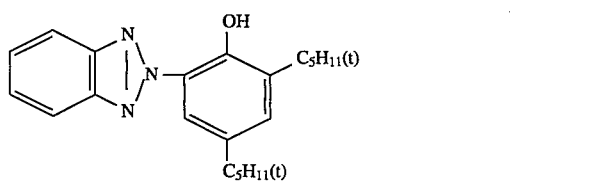
UV-1
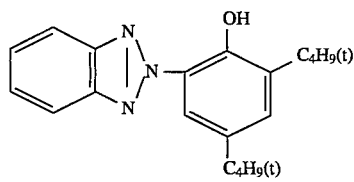
UV-2
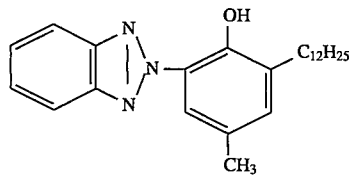
UV-3
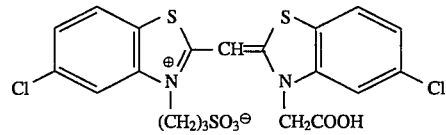
BS-1
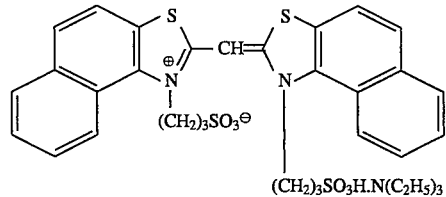
BS-2

-continued

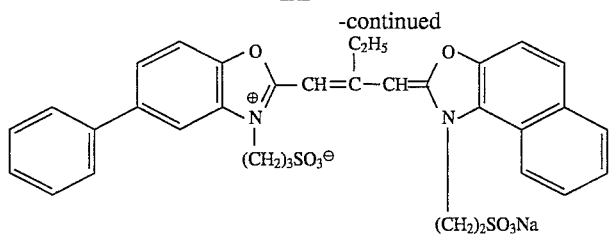 GS-1

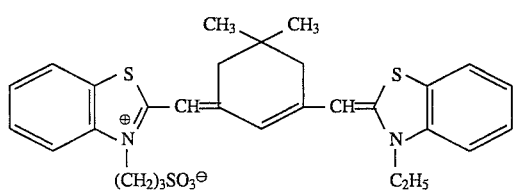 RS-1

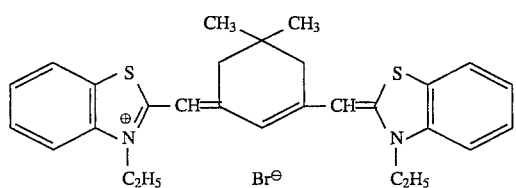 RS-2

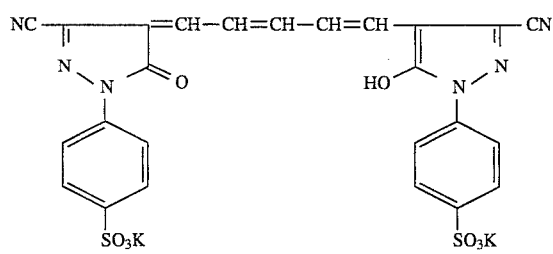 AI-1

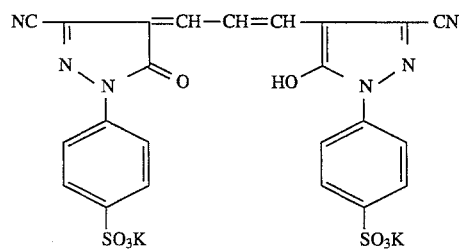 AI-2

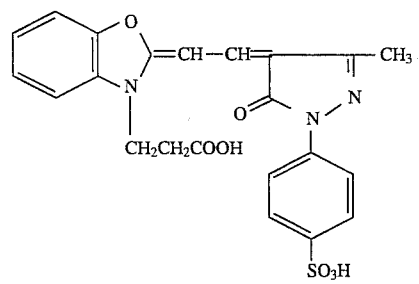 AI-3

The sample was exposed in the usual manner, and then processed according to the following processing steps:

| Processing step | Temperature | Time |
| --- | --- | --- |
| Color developing | 35.0 ± 0.3° C. | 45 seconds |
| Bleach-fix | 35.0 ± 0.5° C. | 45 seconds |
| Stabilizing | 30 to 34° C. | 90 seconds |
| Drying | 60 to 80° C. | 30 seconds |

Color developer

| Pure water | 800 cc |
| --- | --- |

-continued

| Triethanolamine | 10 g |
| --- | --- |
| N,N-diethylhydroxylamine | 5.0 g |
| Potassium bromide | 0.02 g |
| Potassium chloride | 2.0 g |
| Potassium sulfite | 0.30 g |
| Color developing agent | 4.5 g |
| 1-Hydroxyethylidene-1,1-diphosphonic acid | 1.0 g |
| Ethylenediaminetetraacetic acid | 1.0 g |
| Disodium catechol-3,5-disulfonate | 1.0 g |
| Diethylene glycol | 10 g |
| Brightening agent (4,4'-diaminostilbene-sulfonic acid derivative) | 1.0 g |
| Potassium carbonate | 27 g |

-continued

| | |
|---|---|
| Water to make 1 liter, adjust pH to 10.10. | |

Bleach-fix solution

| | |
|---|---|
| Ferric ammonium diethylenetriaminetetra-acetate, dehydrated | 60 g |
| Diethylenetriaminetetraacetic acid | 3 g |
| Ammonium thiosulfate (70% solution) | 100 ml |
| Ammonium sulfite (40% solution) | 27.5 ml |
| Water to make 1 liter, adjust pH to 5.7 with potassium carbonate or glacial acetic acid. | |

Stabilizing solution

| | |
|---|---|
| 5-Chloro-2-methyl-4-isothiazoline-3-one | 0.2 g |
| 1,2-benzoisothiazoline-3-one | 0.3 g |
| Diethylene glycol | 1.0 g |
| Brightening agent (Cinopal SFP) | 2.0 g |
| 1-Hydroxyethylidene-1,1-diphosphonic acid | 2.0 g |
| Ammonia water (20% ammonium hydroxide solution) | 3.0 g |
| Sodium o-Phenylphenol | 1.0 g |
| Ethylenediaminetetraacetic acid | 1.0 g |
| Brightening agent (4,4'-diaminostilbenesulfonic acid derivative) | 1.5 g |
| Water to make 1 liter, adjust pH to 7.0 with sulfuric acid or ammonia water. | |

The emulsions Em-B, Em-G and Em-R were prepared as follows.

Preparation of the blue-sensitive silver halide emulsion

The following Solution A and Solution B were simultaneously added spending 30 minutes under conditions of pAg and pH controlled to 6.5 and 3.0, respectively, and further, the following Solution C and Solution C were simultaneously added spending 180 minutes under conditions of pAg and pH controlled to 7.3 and 5.5, respectively.

The pAg control was conducted according to the method described in JP O.P.I. No. 45437/1984, while the pH control was made by using sulfuric acid or a sodium hydroxide solution.

Solution A:
Prepared by dissolving 3.42 g of sodium chloride and 0.03 g of potassium bromide in water and adding water to make the whole 200 ml.

Solution B:
Prepared by dissolving 10 g of silver nitrate in water and adding water to make the whole 200 ml.

Solution C:
Prepared by dissolving 102.7 g of sodium chloride and 1.0 g of potassium bromide in water and adding water to make the whole 600 ml.

Solution D:
Prepared by adding water to 300 g of silver nitrate to make the whole 600 ml.

After completion of the above additions, the produced emulsion was subjected to desalting treatment by using an aqueous 5% Demol N solution, a product of Kao Atlas Co., and an aqueous 20% magnesium sulfate solution, and then the desalted emulsion was mixed with a gelatin solution, whereby a monodisperse cubic grains emulsion Sample EMP-1, having an average grain diameter of 0.85 μm, a grain size distribution's variation coefficient of 0.07 and a silver chloride content of 99.5 mol %, was obtained.

The above emulsion EMP-1 was subjected to an optimal chemical sensitization treatment at 50° C. with use of the following compounds, whereby a blue-sensitive silver halide emulsion Em-B was obtained.

| | |
|---|---|
| Sodium thiosulfate | 0.8 mg/mol AgX |
| Chloroauric acid | 0.5 mg/mol AgX |
| Stabilizer STAB-1 | $6 \times 10^{-4}$ mol/mol AgX |
| Sensitizing dye BS-1 | $4 \times 10^{-4}$ mol/mol AgX |
| Sensitizing dye BS-2 | $1 \times 10^{-4}$ mol/mol AgX |

Preparation of the green-sensitive silver halide emulsion

A monodisperse cubic grains emulsion EMP-2, having an average grain diameter of 0.43 μm, a variation coefficient of 0.08 and a silver chloride content of 99.5% was prepared in the same manner as in EMP-1 except that the adding durations of Solutions A and B and Solutions C and D were changed.

Emulsion EMP-2 was subjected to optimal chemical sensitization treatment at 55° C. with use of the following compounds, whereby a green-sensitive silver halide emulsion Em-G was obtained.

| | |
|---|---|
| Sodium thiosulfate | 1.5 mg/mol AgX |
| Chloroauric acid | 1.0 mg/mol AgX |
| Stabilizer STAB-1 | $6 \times 10^{-4}$ mol/mol AgX |
| Sensitizing dye GS-1 | $4 \times 10^{-4}$ mol/mol AgX |

Preparation of the red-sensitive silver halide emulsion

A monodisperse cubic grains emulsion EMP-3, having an average grain diameter of 0.50 μm, a variation coefficient of 0.08 and a silver chloride content of 99.5%, was prepared in the same manner as in EMP-1 except that the adding durations of Solutions A and B and Solutions C and D were changed.

In the above preparation, to the Solution C were added the following metallic compounds:

| | |
|---|---|
| $K_2IrCl_6$ | $3.8 \times 10^{-8}$ mol/mol AgX |
| $K_4Fe(CN)_4$ | $1.3 \times 10^{-5}$ mol/mol AgX |

Emulsion EMP-3 was subjected to optimal chemical sensitization treatment at 60° C. with use of the following compounds, whereby a red-sensitive silver halide emulsion Em-R was obtained.

| | |
|---|---|
| Sodium thiosulfate | 1.8 mg/mol AgX |
| Chloroauric acid | 2.0 mg/mol AgX |
| Stabilizer STAB-1 | $6 \times 10^{-4}$ mol/mol AgX |
| Sensitizing dye RS-1 | $1 \times 10^{-4}$ mol/mol AgX |

Further, Samples 2 to 35 were prepared in the same manner except that the silver chlorobromide emulsions (Em-1) of Layers 1, 3 and 5 and the yellow coupler (Y-1) were replaced, in equimolar amounts, with silver bromochloride emulsions (Em-2), Em-B, Em-G and Em-R, and an inventive coupler, respectively, the amount of antiirradiation aye was changed, or the thickness of the support was changed as shown in Table 1, and each of the samples was processed in the same way as Sample 1, except that in Samples 20 to 35, the developing agent was replaced with CD-2.

The reflection densities at wavelengths of 450 nm, 550 nm and 700 nm were measured for each of the unprocessed (raw) samples. Each of the processed samples was evaluated according to the following criteria. The results are shown in Tables 1 and 2.

Color-formability: Maximum blue density ($D_B$) was measured with a densitometer PD-84, manufactured by KONICA Corp.

Halftone quality: The quality of 3% dots was examined visually through a magnifier with respect to yellow (Y), magenta (M), cyan (C) and black (K) dots.

A: Y, M, C and K are all good.
B: Some one of Y, M, C and K is bad.
C: Two or more of Y, M, C and K are bad.

Color reproducibility: Comparison of the reproduced yellow density with a printed matter was visually evaluated
   A: Comparable with printed matter's.
   B: Very closed to printed matter's.
   C: Slightly different from printed matter's.
   D: Different from printed matter's.

Handling characteristics: The handling characteristics of each sample in the general proof-sheet size (570×800 mm) were evaluated.
   A: As handy as printed matter.
   B: Less handy than printed matter.

formability and halftone quality as well as in the color reproducibility.

In the constituents of the invention, by making the support thinner, its handling characteristics can be improved without degrading the halftone quality.

Samples 36 to 40 were prepared in like manner except that the silver bromochloride emulsions of Layers 1, 3 and 5 of each of the foregoing Samples 9, 15, 17, 20 and 27 were replaced by equimolar amounts of the following emulsions Em-B', Em-G' and Em-R', respectively, and then evaluated in like manner. Consequently, the effect of the invention was able to be obtained.

Em-B': A monodisperse cubic grains emulsion having an average grain diameter of 0.88 μm, a variation coefficient of 0.08 and a silver chloride content of 85.2%.

TABLE 1

| Sample No. | Emulsion | Y coupler | Reflection density 450 nm | 550 nm | 700 nm | Support thickness (μm) | Developing agent | Color formability ($D_B$) | Halftone qlty | Color reproducibility | Handling characteristics |
|---|---|---|---|---|---|---|---|---|---|---|---|
| 1 (") | Em 1 | Y-1 | 0.90 | 1.00 | 1.10 | 230 | EXCD* | 1.10 | C | C | B |
| 2 (") | Em 1 | 26 | 0.90 | 1.00 | 1.10 | 230 | EXCD | 1.12 | C | C | B |
| 3 (") | Em 1 | 28 | 0.90 | 1.00 | 1.10 | 230 | EXCD | 1.13 | C | C | B |
| 4 (Comp.) | Em 1 | 8 | 0.90 | 1.00 | 1.10 | 230 | EXCD | 1.30 | C | C | B |
| 5 (Inv.) | Em 2 | 10 | 0.90 | 1.00 | 1.10 | 230 | EXCD | 1.92 | A | C | B |
| 6 (") | Em 2 | 35 | 0.90 | 1.00 | 1.10 | 230 | EXCD | 1.90 | A | C | B |
| 7 (") | Em 2 | 45 | 0.90 | 1.00 | 1.10 | 230 | EXCD | 1.94 | A | C | B |
| 8 (") | Em 2 | 1 | 0.90 | 1.00 | 1.10 | 230 | EXCD | 2.03 | A | C | B |
| 9 (Comp.) | Em 2 | Y-1 | 0.40 | 0.50 | 0.70 | 230 | EXCD | 1.82 | C | D | B |
| 10 (") | Em 2 | Y-1 | 0.40 | 0.90 | 1.00 | 230 | EXCD | 1.88 | B | D | B |
| 11 (Inv.) | Em 2 | Y-1 | 0.90 | 0.90 | 1.10 | 230 | EXCD | 1.88 | A | D | B |
| 12 (Comp.) | Em 2 | 26 | 0.60 | 0.50 | 1.00 | 230 | EXCD | 2.02 | C | C | B |
| 13 (") | Em 2 | 26 | 0.60 | 1.00 | 1.10 | 230 | EXCD | 2.08 | B | C | B |
| 14 (Inv.) | Em 2 | 26 | 0.90 | 1.00 | 1.10 | 230 | EXCD | 2.07 | A | C | B |
| 15 (") | Em 2 | 28 | 0.90 | 1.00 | 1.10 | 230 | EXCD | 2.18 | A | C | B |
| 16 (") | Em 2 | 44 | 0.90 | 1.00 | 1.10 | 230 | EXCD | 2.19 | A | C | B |
| 17 (") | Em 2 | 8 | 0.90 | 1.00 | 1.10 | 230 | EXCD | 2.16 | A | C | B |

*EXCD: N-ethyl-N-(β-methanesulfonamidoethyl)-3-methyl-4-aminoaniline sulfate

TABLE 2

| Sample No. | Emulsion | Y coupler | Reflection density 450 nm | 550 nm | 700 nm | Support thickness (μm) | Developing agent | Color formability ($D_B$) | Halftone qlty | Color reproducibility | Handling characteristics |
|---|---|---|---|---|---|---|---|---|---|---|---|
| 18 (Inv.) | Em 2 | 10 | 1.00 | 1.00 | 1.10 | 230 | EXCD* | 2.29 | A | C | B |
| 29 (") | Em 2 | 35 | 1.00 | 1.00 | 1.10 | 230 | EXCD | 2.20 | A | C | B |
| 20 (") | Em 2 | 35 | 1.00 | 1.00 | 1.10 | 230 | CD-2 | 2.18 | A | A | B |
| 21 (") | Em 2 | 45 | 1.00 | 1.00 | 1.10 | 230 | CD-2 | 2.18 | A | A | B |
| 22 (") | Em 2 | 1 | 1.00 | 1.00 | 1.10 | 230 | CD-2 | 2.27 | A | A | B |
| 23 (") | Em 2 | 2 | 1.00 | 1.00 | 1.10 | 230 | CD-2 | 2.28 | A | A | B |
| 24 (") | Em 2 | 2 | 1.00 | 1.00 | 1.10 | 130 | CD-2 | 2.26 | A | A | A |
| 25 (") | Em 2 | 2 | 1.00 | 1.00 | 1.10 | 130 | CD-2 | 2.26 | A | A | A |
| 26 (") | Em 2 | 45 | 1.00 | 1.00 | 1.10 | 130 | CD-2 | 2.29 | A | A | A |
| 27 (Comp.) | Em 2 | 1 | 0.40 | 0.50 | 0.70 | 130 | CD-2 | 2.19 | C | A | A |
| 28 (") | Em 2 | 1 | 0.40 | 1.00 | 1.10 | 130 | CD-2 | 2.25 | C | A | A |
| 29 (Inv.) | Em 2 | 1 | 1.01 | 1.00 | 1.10 | 130 | CD-2 | 2.24 | A | A | A |
| 30 (Comp.) | Em 2 | 1 | 0.40 | 0.50 | 0.70 | 130 | CD-2 | 2.29 | C | A | A |
| 31 (") | Em 2 | 1 | 0.40 | 1.00 | 1.10 | 130 | CD-2 | 2.25 | C | A | A |
| 32 (Inv.) | Em 2 | 1 | 1.01 | 1.00 | 1.10 | 130 | CD-2 | 2.25 | A | A | A |
| 33 (Comp.) | Em 2 | 2 | 0.40 | 0.50 | 0.70 | 130 | CD-2 | 2.27 | C | A | A |
| 34 (") | Em 2 | 2 | 0.40 | 1.00 | 1.10 | 130 | CD-2 | 2.26 | C | A | A |
| 35 (Inv.) | Em 2 | 2 | 1.01 | 1.00 | 1.10 | 130 | CD-2 | 2.26 | A | A | A |

*EXCD: N-ethyl-N-(β-methanesulfonamidoethyl)-3-methyl-4-aminoaniline sulfate

As is apparent from Tables 1 and 2, each of the samples of the invention, in which the high-chloride silver halide emulsion of the invention is contained and the reflection density of the unprocessed light-sensitive material is adapted to the requirement of the invention, is excellent in the color Em-G': A monodisperse cubic grains emulsion having an average grain diameter of 0.47 μm, a variation coefficient of 0.09 and a silver chloride content of 85.1%.

Em-R': A monodisperse cubic grains emulsion having an average grain diamter of 0.5 3 μm, a variation coefficient of 0.08 and a silver chloride content of 85.2%.

EXAMPLE 2

A paper support of 100 μm in thickness having polyethylene laminated on both sides was used to have one side thereof coated with the following Layers 1 to 7 and the other side coated with the following Layers 8 and 9, wherein the polyethylene on the Layer 1-coated side contains 4 g/m² of titanium oxide as a white pigment and also contains 0.003 g/m² of ultramarine as a blue-tinting agent.

The coating weight of each of the constituents of the layers is indicated in g/m² except that each silver halide emulsion is shown in silver equivalent. The different emulsions used in the respective layers were prepared, changing temperature to change the grain size, according to the hereinafter described method for making emulsions.

| Layer | Constituent | Coating wt |
|---|---|---|
| Layer 7 (Antihalation layer) | Gelatin | 1.06 |
| | Acryl-denatured polyvinyl alcohol copolymer (denaturation rate 17%) | 0.17 |
| | Fluid paraffin | 0.03 |
| Layer 6 (Interlayer) | Gelatin | 0.42 |
| | UV absorbent UV-4 | 0.07 |
| | UV absorbent UV-5 | 0.07 |
| | UV absorbent UV-6 | 0.07 |
| | Solvent SO-4 | 0.08 |
| Layer 5 (Red-sensitive layer) | Gelatin | 1.06 |
| | Red-sensitive silver bromochloride emulsion (silver chloride content: 99.5%) | 0.20 |
| | Cyan coupler C-2 | 0.30 |
| | Anti-color-crossover agent HQ-4 | 0.18 |
| | Anti-color-crossover agent HQ-5 | 0.003 |
| | Dispersion medium POLY-1 | 0.03 |
| | Solvent SO-3 | 0.04 |
| | Solvent SO-4 | 0.04 |
| | Solvent SO-5 | 0.04 |
| | Antiirradiation dye AI-5 | 0.01 |
| | Antiirradiation dye AI-6 | 0.01 |
| Layer 4 (UV absorging layer) | Gelatin | 1.25 |
| | UV absorbent UV-4 | 0.21 |
| | UV absorbent UV-5 | 0.21 |
| | UV absorbent UV-6 | 0.21 |
| | Anti-color-crossover agent HQ-2 | 0.05 |
| | Anti-color-crossover agent HQ-6 | 0.05 |
| | Solvent SO-1 | 0.12 |
| | Solvent SO-6 | 0.12 |
| Layer 3 (Green-sensitive layer) | Gelatin | 1.06 |
| | Green-sensitive silver bromochloride emulsion (silver chloride content: 98.5%) | 0.13 |
| | Magenta coupler M-2 | 0.32 |
| | Toning agent MY-1 | 0.04 |
| | Antistain agent AS-1 | 0.02 |
| | Antistain agent AS-2 | 0.02 |
| | Antistain agent AS-3 | 0.02 |
| | Anti-color-crossover agent HQ-4 | 0.05 |
| | Antidiscoloration agent ST-1 | 0.05 |
| | Antidiscoloration agent ST-2 | 0.05 |
| | Dispersion medium POLY-1 | 0.05 |
| | Solvent SO-1 | 0.12 |
| | Solvent SO-6 | 0.12 |
| Layer 2 (Interlayer) | Gelatin | 0.79 |
| | Anti-color-crossover agent HQ-6 | 0.08 |
| | Solvent SO-7 | 0.08 |
| | Antiirradiation dye AI-4 | 0.01 |
| Layer 1 (Blue-sensitive layer) | Gelatin | 1.45 |
| | Blue-sensitive silver bromochloride emulsion (silver chloride content: 99.6%) | 0.28 |
| | Yellow coupler Y-2 | 0.83 |
| | Antidiscoloration agent ST-3 | 0.10 |
| | Anti-color-crossover agent HQ-4 | 0.05 |
| | Solvent SO-4 | 0.10 |
| | Dispersion medium POLY-1 | 0.05 |
| Layer 8 (Backing layer 1) | Gelatin | 2.50 |
| | UV absorbent UV-4 | 0.15 |
| | UV absorbent UV-5 | 0.15 |
| | UV absorbent UV-6 | 0.15 |
| Layer 9 (Backing layer 2) | Gelatin | 2.00 |
| | Polymethyl methacrylate particles (average particle size: 2.4 μm) | 0.025 |
| | Silicon oxide (average particle size: 5 μm) | 0.025 |

In addition, hardener H-1 was used.

Sixteen different samples as shown in Table 3 were prepared in the same manner as in Example 1 except that silver bromochloride emulsions (Em-3), with silver bromide locally present on the corner of each grain thereof, were used in place of the emulsions used in Example 1. The emulsions were prepared as follows:

Preparation of blue-sensitive silver halide emulsion

To 1000 ml of an aqueous 2.5% gelatin solution heated at 58° C. were added Solutions A and B, and then Solutions C and D simultaneously spending 45 minutes, and 10 minutes later added Solutions E and F simultaneously over a period of 15 minutes. Further Solution G was added, and 10 minutes layer Solutions H and I were simultaneously added over a period of 20 minutes. Five minutes after completion of the addition, the temperature was lowered to desalt the emulsion, water and dispersion gelatin were added, and pH was adjusted to 6.2, whereby a monodisperse silver bromochloride emulsion EMP-4 having an average grain diameter of 0.92 μm, a variation coefficient of 0.10 and a silver chloride content of 99.6% was obtained.

Solution A: 1N sulfuric acid: 20 ml

Solution B: N,N'-dimethylethylenethiourea (1% solution): 2 ml

Solution C: Dissolve 1.7 g of sodium chloride in water and add water to make the whole 140 ml.

Solution D: Dissolve 5.0 g of silver nitrate in water and add water to make the whole 140 ml.

Solution E: Dissolve 41.1 g of sodium chloride in water and add water to make the whole 320 ml.

Solution F: Dissolve 119.5 g of silver nitrate in water and add water to make the whole 320 ml.

Solution G: Dissolve $4\times10^{-4}$ mol of sensitizing dye BS-3 in ethyl alcohol and add ethyl alcohol to make the whole 20 ml.

Solution H: Dissolve 0.35 g of potassium bromide and 0.012 g of $K_2IrCl_6$ in water and add water to make the whole 50 ml.

Solution I: Dissolve 0.5 g of silver nitrate in water and add water to make the whole 50 ml.

The above EMP-4 was optimally chemically ripened at 58° C. with use of the following compounds to thereby obtain a blue-sensitive silver halide emulsion EmB-2.

| Triethylthiourea | 1 mg/mol AgX |
|---|---|
| Stabilizer STAB-2 | $3.8 \times 10^{-4}$ mol/mol AgX |

Preparation of green-sensitive silver halide emulsion

A monodisperse silver bromochloride emulsion EMP-5, having an average grain diameter of 0.51 μm, a variation coefficient of 0.078 and a silver chloride content of 98.5%, was prepared in the same manner as in EMP-4 except that the adding duration of Solutions C and D was changed and the Solutions E, F, G, H and I were replaced by the following Solutions J, K, L, M and N, respectively.

Solution J: Dissolve 40.6 g of sodium chloride in water and add water to make the whole 320 ml.

Solution K: Dissolve 118.1 g of silver nitrate in water and add water to make the whole 320 ml.

Solution L: Dissolve $3 \times 10^{-4}$ mol of sensitizing dye GS-2 and $5 \times 10^{-5}$ mol of sensitizing dye GS-3 in ethyl alcohol and add ethyl alcohol to make the whole 20 ml.

Solution M: Dissolve 1.3 g of potassium bromide and 0.024 g of $K_2IrCl_6$ in water and add water to make the whole 50 ml.

Solution N: Dissolve 1.9 g of silver nitrate in water and add water to make the whole 50 ml.

The above emulsion EMP-5 was optimally chemically ripened at 58° C. with use of the following compounds, whereby a green-sensitive silver halide emulsion EmB-2 was obtained.

| Triethylthiourea | 1 mg/mol AgX |
|---|---|
| Stabilizer STAB-2 | $5.3 \times 10^{-4}$ mol/mol AgX |

Preparation of red-sensitive silver halide emulsion

A monodisperse silver chlorobromide emulsion EMP-6, having an average grain diameter of 0.60 μm, a variation coefficient of 0.072 and a silver chloride content of 99.5%, was prepared in the same manner as in EMP-4 except that the adding duration of the Solutions C and D was changed and the Solutions E, F, G, H and I were replaced by the following Solutions O, P, Q, R and S, respectively.

Solution O: Dissolve 41.06 g of sodium chloride in water and add water to make the whole 320 ml.

Solution P: Dissolve 119.4 g of silver nitrate in water and add water to make the whole 320 ml.

Solution Q: Dissolve $7 \times 10{-5}$ mol of sensitizing dye RS-3 in ethyl alcohol, and add ethyl alcohol to make the whole 20 ml.

Solution R: Dissolve 0.44 g of potassium bromide and 0.10 g of $K_2IrCl_6$ in water and add water to make the whole 50 ml.

Solution S: Dissolve 0.63 g of silver nitrate in water and add water to make the whole 50 ml.

The above emulsion EMP-6 was optimally chemically ripened at 60° C. with use of the following compounds, whereby a red-sensitive silver halide emulsion EmR-2 was obtained.

| Triethylthiourea | 1 mg/mol AgX |
|---|---|
| Stabilizer STAB-2 | $5.3 \times 10^{-4}$ mol/mol AgX |
| Supersensitizer SS-1 | $2.6 \times 10^{-3}$ mol/mol AgX |

The compounds used in above are as follows:

HQ-5: 2-methyl-5-octadecylhydroquinone

HQ-6: 2,5-di-sec-octylhydroquinone

POLY-1: Poly-N-t-butylacrylamide (polymerization degree: 100 to 1000)

ST-2: N-(4-dodecyloxyphenyl)morpholine

STAB-2: 1-(3-acetamido)phenyl-5-mercaptotetrazole

SO-4: Trinonyl phosphate

SO-5: Di(3-methylhexyl) phthalate

SO-6: Tricresyl phosphate

SO-7: Dibutyl phthalate

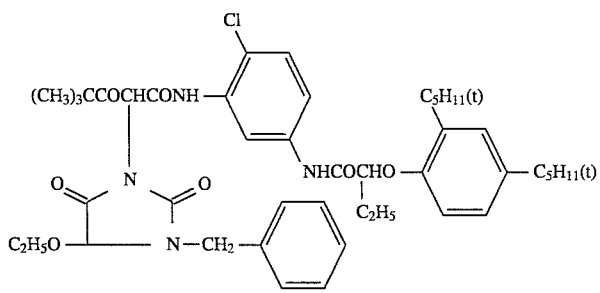

Y-2

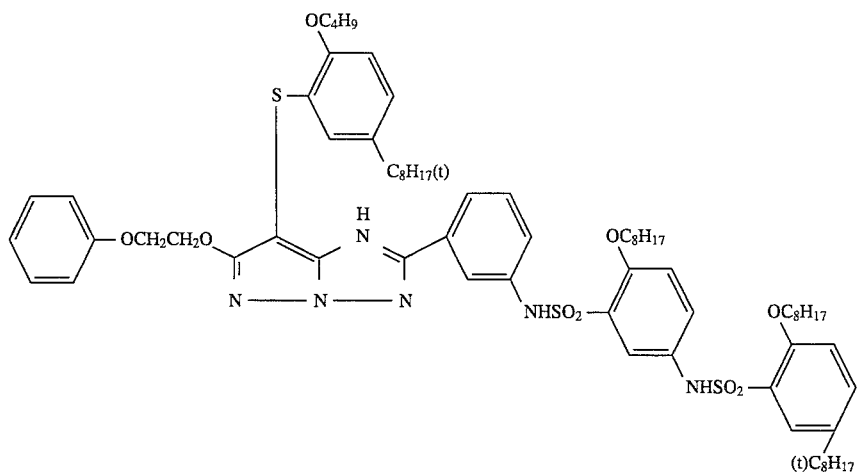

M-2

-continued
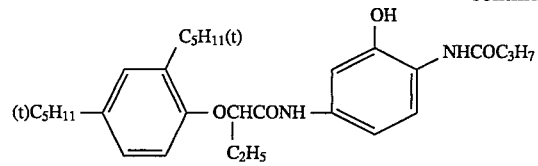 C-2
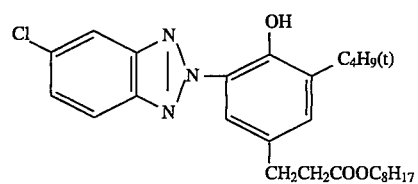 UV-4
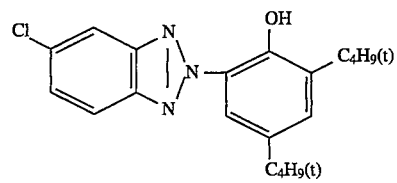 UV-5
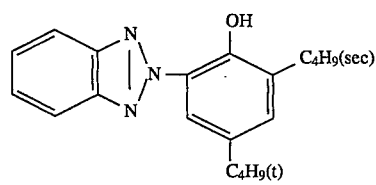 UV-6
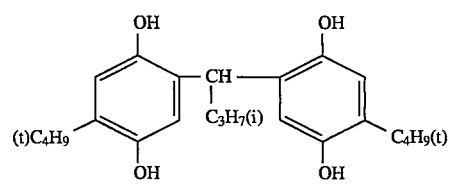 HQ-4
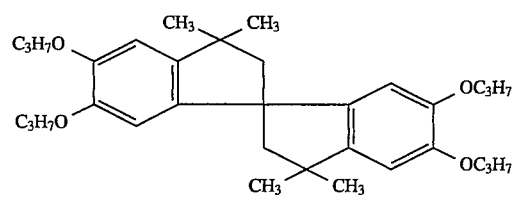 ST-1
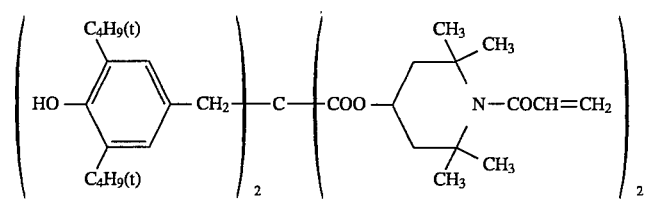 ST-3
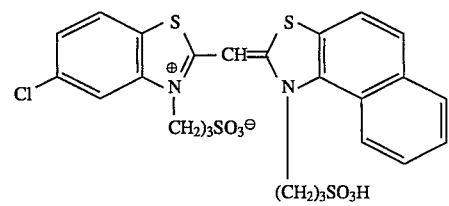 BS-3

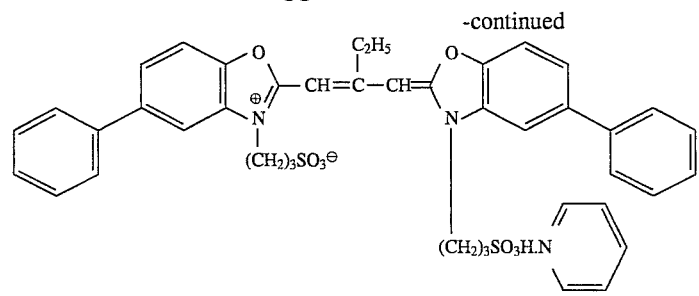
GS-2
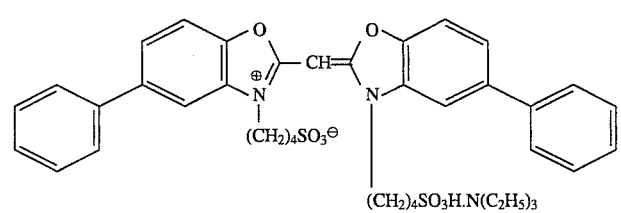
GS-3
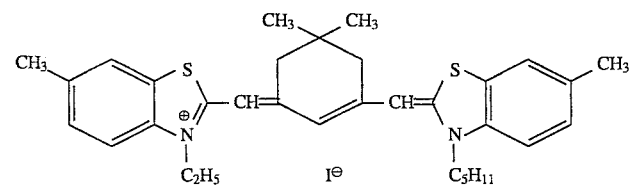
RS-3
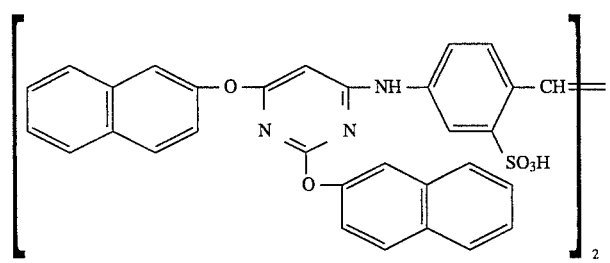
SS-1
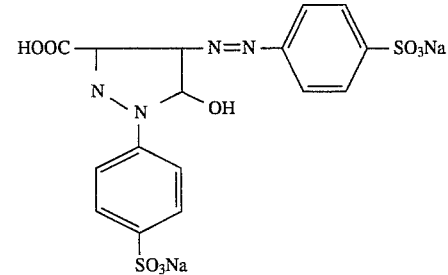
AI-4
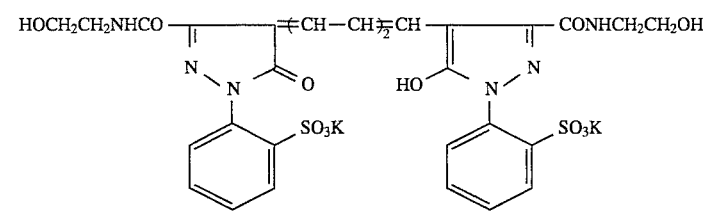
AI-5
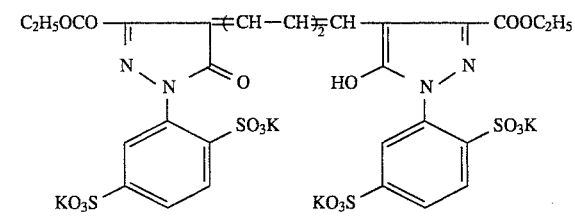
AI-6

Each of the samples was exposed and processed in the same manner as in Example 1, and the characteristics thereof were evaluated also in the same manner as in Example 1. The results are shown in Table 9.

TABLE 3

| Sample No. | Emulsion | Y coupler | Unprocessed reflection density 450 nm | 550 nm | 700 nm | Support thickness (μm) | Developing agent | Color formability ($D_B$) | Halftone qlty | Color reproducibility | Handling characteristics |
|---|---|---|---|---|---|---|---|---|---|---|---|
| 40 (Inv.)   | Em 3 | Y-2 | 1.00 | 1.00 | 1.10 | 230 | CD-6 | 2.16 | A | C | B |
| 41 (")      | Em 3 | 45  | 1.00 | 1.00 | 1.10 | 230 | CD-6 | 2.19 | A | A | B |
| 42 (")      | Em 3 | 1   | 1.00 | 1.00 | 1.10 | 230 | CD-6 | 2.25 | A | A | B |
| 43 (")      | Em 3 | 2   | 1.00 | 1.00 | 1.10 | 230 | CD-6 | 2.22 | A | A | B |
| 44 (")      | Em 3 | 2   | 1.00 | 1.00 | 1.10 | 130 | CD-6 | 2.26 | A | A | A |
| 45 (")      | Em 3 | 2   | 1.00 | 1.00 | 1.10 | 130 | CD-6 | 2.25 | A | A | A |
| 46 (")      | Em 3 | 45  | 1.00 | 1.00 | 1.10 | 130 | CD-6 | 2.23 | A | A | A |
| 47 (Comp.)  | Em 3 | 1   | 0.40 | 0.50 | 0.70 | 130 | CD-6 | 2.20 | C | B | A |
| 48 (")      | Em 3 | 1   | 0.40 | 1.00 | 1.10 | 130 | CD-6 | 2.23 | C | B | A |
| 49 (Inv.)   | Em 3 | 1   | 1.01 | 1.00 | 1.10 | 130 | CD-6 | 2.22 | A | A | A |
| 50 (Comp.)  | Em 3 | 1   | 0.40 | 0.50 | 0.70 | 130 | CD-6 | 2.24 | C | B | A |
| 51 (")      | Em 3 | 1   | 0.40 | 1.00 | 1.10 | 130 | CD-6 | 2.23 | C | B | A |
| 52 (Inv.)   | Em 3 | 1   | 1.01 | 1.00 | 1.10 | 130 | CD-6 | 2.22 | A | A | A |
| 53 (Comp.)  | Em 3 | 2   | 0.40 | 0.50 | 0.70 | 130 | CD-6 | 2.24 | C | B | A |
| 54 (")      | Em 3 | 2   | 0.40 | 1.00 | 1.10 | 130 | CD-6 | 2.22 | C | B | A |
| 55 (Inv.)   | Em 3 | 2   | 1.01 | 1.00 | 1.10 | 130 | CD-6 | 2.23 | A | A | A |

The results in Table 3 also show that each of the samples in which the yellow coupler of the invention is used and the reflection densities of raw material sample are adapted to the requirements of the invention is excellent in the color formability and halftone quality as well as in the color reproducibility.

What is claimed is:

1. A silver halide color photographic light-sensitive material comprising a support having thereon a blue-sensitive emulsion layer, a green-sensitive emulsion layer and a red-sensitive emulsion layer, wherein at least one of the emulsion layers comprises silver halide grains having a silver chloride content of not less than 80 mol % and said photographic material, when unprocessed, has a reflection density of not less than 0.8 at wavelengths of 450, 550 and 700 nm.

2. The color photographic material of claim 1, wherein said blue-sensitive layer contains a coupler represented by the following Formula I

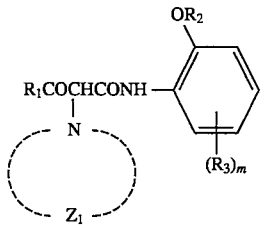

Formula I wherein $R_1$ represents an alkyl group or a cycloalkyl group; $R_2$ represents an alkyl group, a cycloalkyl group or an aryl group; $R_3$ represents a substituent; m is an integer of 0 to 4, provided, when m is 2 or more, $R_3$ groups may be either the same or different; and $Z_1$ represents a group of nonmetallic atoms necessary to form a 5- or 6-membered ring.

3. The color photographic material of claim 2, wherein in Formula (I), $R_2$ is an alkyl group, m is 1 and $R_3$ is

wherein X represents a carbonyl group or a sulfonyl group; L represents a alkylene group or an arylene group; and Y represents a divalent group; n is an integer of 0 or 1; and $R_5$ represents an alkyl group, a cycloalkyl group or an aryl group.

4. The color photographic material of claim 1, wherein said support has a thickness of 80 to 180 μm.

5. A method of forming a color image which comprises image exposing and processing a silver halide color photographic material comprising a support having thereon a blue-sensitive emulsion layer, a green-sensitive emulsion layer and a red-sensitive emulsion layer in a color developer solution comprising a developing agent represented by Formula II; and wherein at least one of the emulsion layers comprises silver halide grains having a silver chloride content of not less than 80 mol %; said blue-sensitive emulsion layer contains a coupler represented by Formula I; and said photographic material, when unprocessed, has a reflection density of not less than 0.8 at wavelengths of 450, 550 and 700 nm;

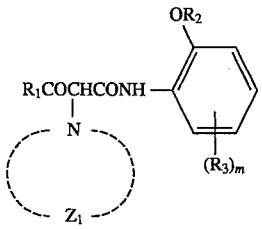

Formula I wherein $R_1$ represents an alkyl group or a cycloalkyl group; $R_2$ represents an alkyl group, a cycloalkyl group or an aryl group; $R_3$ represents a substituent; m is an integer of 0 to 4, provided, when m is 2 or more, $R_3$ groups may be either the same or different; and $Z_1$ represents a group of nonmetallic atoms necessary to form a 5- or 6-membered ring,

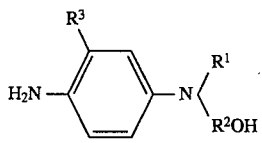

Formula II wherein $R^1$ is an alkyl group having 1 to 4 carbon atoms, $R^2$ is an alkylene group having 2 to 4 carbon atoms and $R^3$ is a hydrogen atom or an alkyl group having 1 to 4 carbon atoms.

* * * * *